(12) United States Patent
Minamio et al.

(10) Patent No.: US 9,136,193 B2
(45) Date of Patent: Sep. 15, 2015

(54) SEMICONDUCTOR DEVICE AND METHOD OF MANUFACTURING THE SAME

(71) Applicant: Panasonic Corporation, Kadoma-shi, Osaka (JP)

(72) Inventors: Masanori Minamio, Osaka (JP); Zyunya Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/982,720

(22) PCT Filed: Dec. 10, 2012

(86) PCT No.: PCT/JP2012/007864
§ 371 (c)(1),
(2) Date: Mar. 7, 2014

(87) PCT Pub. No.: WO2013/121491
PCT Pub. Date: Aug. 22, 2013

(65) Prior Publication Data
US 2014/0299982 A1    Oct. 9, 2014

(30) Foreign Application Priority Data

Feb. 13, 2012    (JP) .................................. 2012-027895

(51) Int. Cl.
*H01L 23/34*    (2006.01)
*H01L 23/52*    (2006.01)
(Continued)

(52) U.S. Cl.
CPC .............. *H01L 23/02* (2013.01); *H01L 23/053* (2013.01); *H01L 23/36* (2013.01); *H01L 23/495* (2013.01); *H01L 24/66* (2013.01); *H01L 24/85* (2013.01); *H01L 25/165* (2013.01);
(Continued)

(58) Field of Classification Search
CPC ......... H01L 23/02; H01L 23/36; H01L 24/66; H01L 23/495; H01L 24/85
USPC .................................................. 257/712, 786
See application file for complete search history.

(56) References Cited

U.S. PATENT DOCUMENTS 6,421,244 B1 *    7/2002  Shinohara et al. ............ 361/736
6,867,484 B2      3/2005  Nakajima et al.
(Continued)

FOREIGN PATENT DOCUMENTS

JP    09-102580      4/1997
JP    2003-100987    4/2003
(Continued)

OTHER PUBLICATIONS

Extended European Search Report, May 27, 2015; European Patent Application No. 12866999.1 (6 pages).

*Primary Examiner* — Luan C Thai
(74) *Attorney, Agent, or Firm* — Hamre, Schumann, Mueller & Larson, P.C.

(57) ABSTRACT

A semiconductor device includes a package 1, a block-module 2, and a control board 3 for controlling power semiconductor elements 11a. The block-module 2 has embedded power semiconductor elements 11a and second leads 4b and first leads 4a that are drawn from the block-module 2. The package 1 has external connection terminals 6a in contact with the first leads 4a of the block-module 2. The second leads 4b are connected to the control board 3 while the first leads 4a are joined to the external connection terminals 6a.

11 Claims, 21 Drawing Sheets

(51) Int. Cl.
  *H01L 23/48* (2006.01)
  *H01L 23/02* (2006.01)
  *H01L 25/16* (2006.01)
  *H01L 23/36* (2006.01)
  *H01L 23/495* (2006.01)
  *H01L 23/00* (2006.01)
  *H01L 23/053* (2006.01)
  *H01L 23/31* (2006.01)
  *H01L 23/373* (2006.01)
  *H01L 23/433* (2006.01)
  *H05K 3/30* (2006.01)

(52) U.S. Cl.
  CPC ........ *H01L 23/3107* (2013.01); *H01L 23/3735* (2013.01); *H01L 23/4334* (2013.01); *H01L 23/49575* (2013.01); *H01L 2224/45015* (2013.01); *H01L 2224/45124* (2013.01); *H01L 2224/48091* (2013.01); *H01L 2224/48137* (2013.01); *H01L 2224/48139* (2013.01); *H01L 2924/1305* (2013.01); *H01L 2924/1306* (2013.01); *H01L 2924/13055* (2013.01); *H01L 2924/13091* (2013.01); *H05K 3/306* (2013.01); *H05K 2201/10166* (2013.01)

(56) References Cited

U.S. PATENT DOCUMENTS

| | | | |
|---|---|---|---|
| 7,449,726 B2 * | 11/2008 | Nakanishi et al. | 257/177 |
| 7,701,054 B2 | 4/2010 | Stolze et al. | |
| 8,169,784 B2 * | 5/2012 | Sakamoto et al. | 361/729 |
| 8,436,459 B2 | 5/2013 | Oka et al. | |
| 2002/0024120 A1 | 2/2002 | Yoshimatsu et al. | |
| 2003/0197255 A1 | 10/2003 | Nakajima et al. | |
| 2009/0086442 A1 | 4/2009 | Sakamoto et al. | |
| 2011/0089558 A1 | 4/2011 | Muto et al. | |

FOREIGN PATENT DOCUMENTS

| | | |
|---|---|---|
| JP | 2003-243609 | 8/2003 |
| JP | 2006-303006 | 11/2006 |
| JP | 2007-116172 | 5/2007 |
| JP | 2008-27993 | 2/2008 |
| JP | 2008-42091 | 2/2008 |
| JP | 4108909 B | 4/2008 |
| JP | 2008-199022 | 8/2008 |
| JP | 4177571 B | 8/2008 |
| JP | 2001-189416 | 7/2010 |
| JP | 2010-283014 | 12/2010 |
| JP | 4634498 B | 2/2011 |
| JP | 2011-86889 | 4/2011 |

* cited by examiner

F I G. 1 5
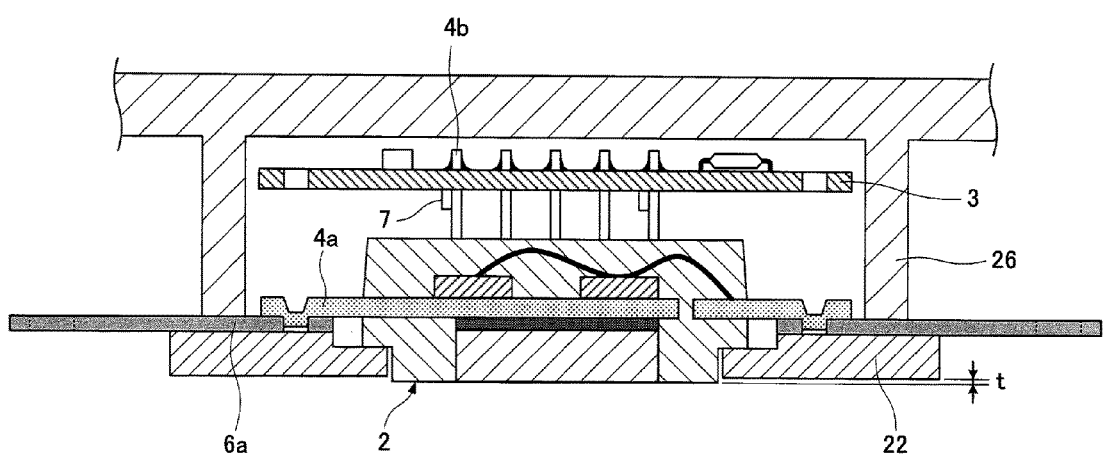

FIG. 18
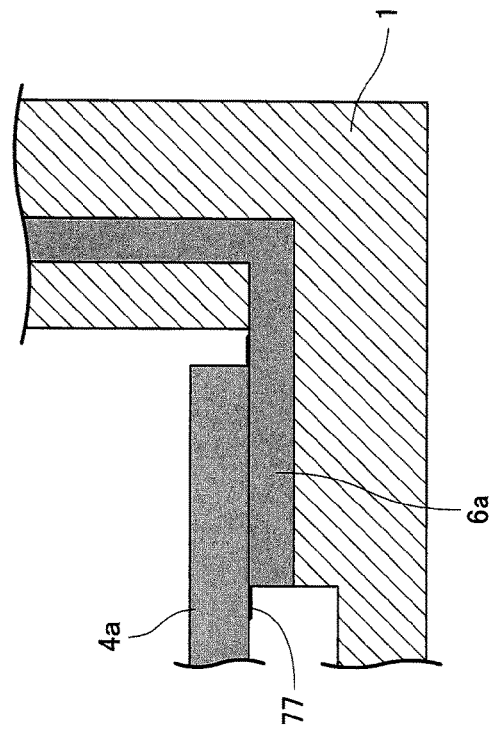
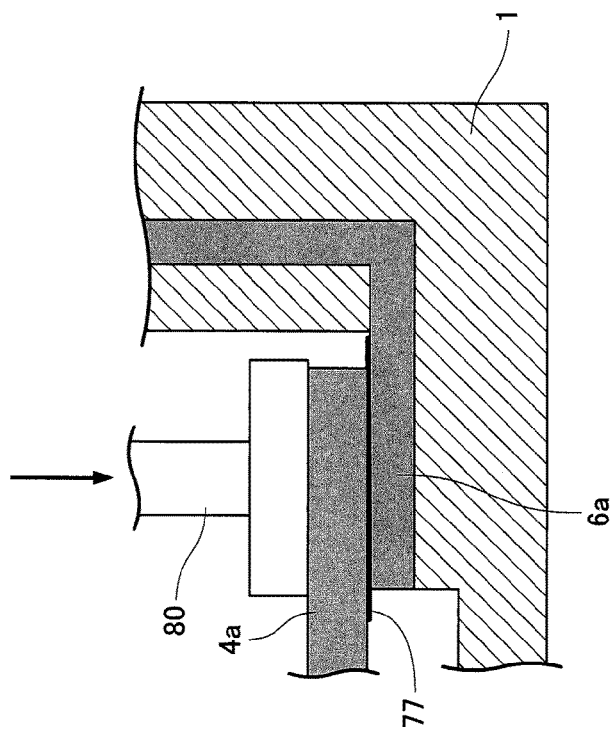

FIG. 19
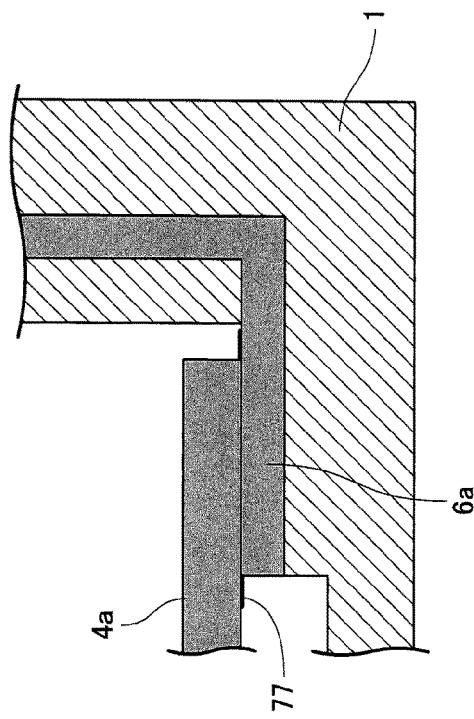
(a)
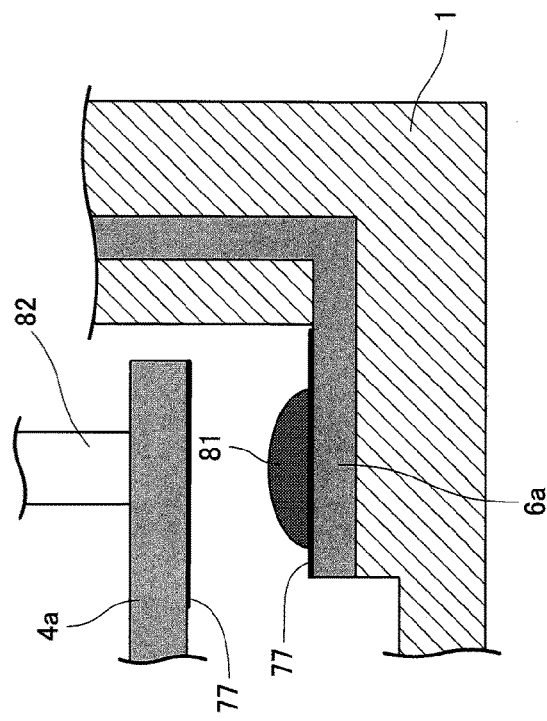
(b)

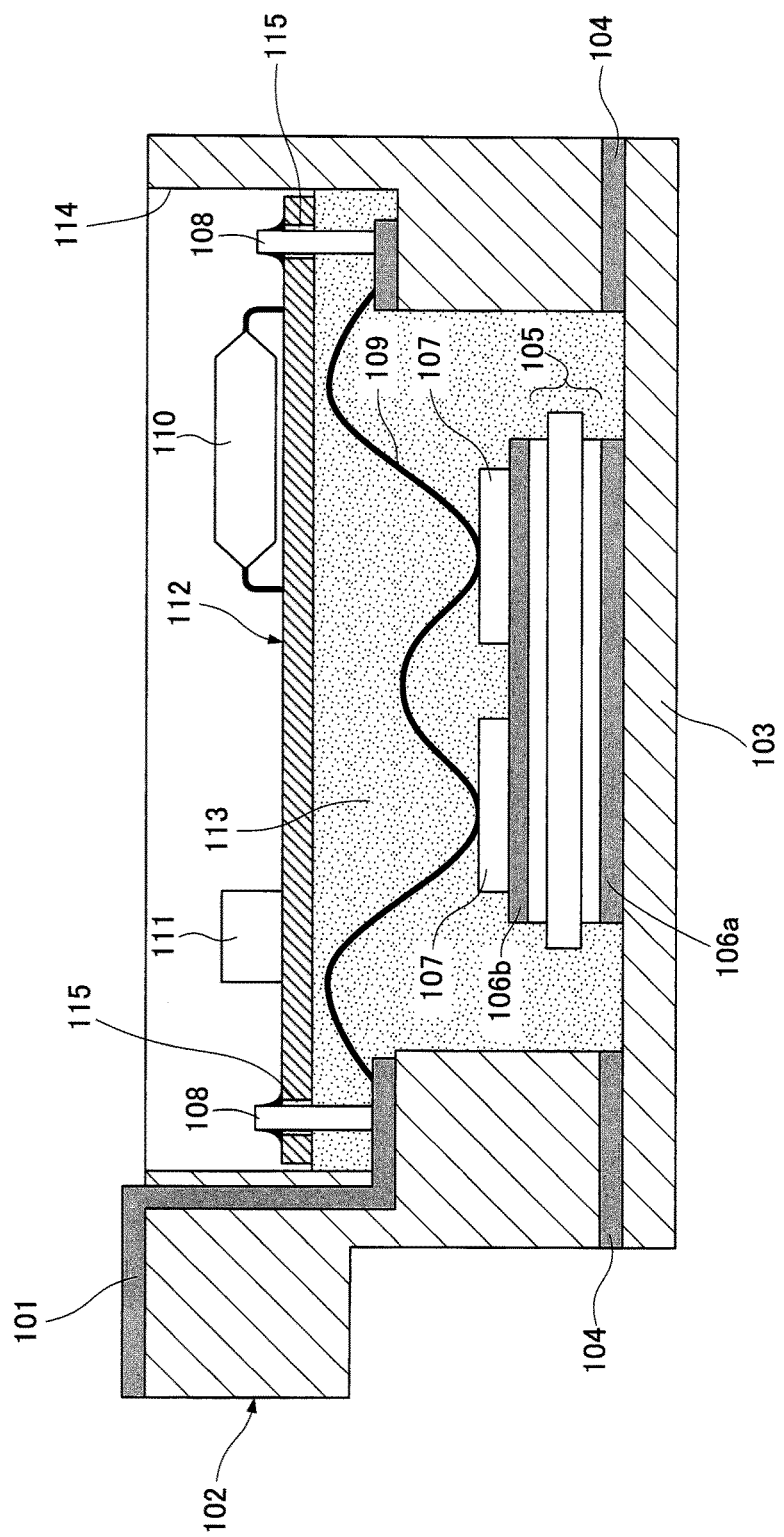
F I G. 2 2   PRIOR ART

SEMICONDUCTOR DEVICE AND METHOD OF MANUFACTURING THE SAME

TECHNICAL FIELD

The present invention relates to a semiconductor device and a method of manufacturing the same. The present invention particularly relates to a semiconductor device used for power conversion, e.g., a power device or an inverter.

BACKGROUND ART

A semiconductor device (power device) is used for rotation control of a power conditioner or a motor in a photovoltaic power generation system. In order to reduce a footprint, shorten a distance between semiconductor elements to obtain higher performance, and reduce a design load for a user in such a semiconductor device, products (packaged semiconductor devices) including package modules have been increasingly used (for example, see Patent Literatures 1 to 3), the package module containing multiple power devices.

A packaged semiconductor device is called a power module. The power module contains a plurality of power semiconductor elements, e.g., IGBTs (insulated gate bipolar transistors) for switching or MOSFETs (Metal-Oxide-Semiconductor Field Effect Transistors). The power module further contains a plurality of driver elements for driving the power semiconductor elements and a plurality of passive elements. Power modules capable of driving and protecting power semiconductors are particularly called IPMs (Intelligent Power Modules) and have been increasingly available on the market.

As illustrated in FIG. 22, a resin case 102 having an insert-molded metal terminal 101 is used in a conventional semiconductor device. Moreover, a metal plate 103 mainly composed of Cu is attached to the bottom of the resin case 102 with an adhesive 104.

An insulating substrate 105 is joined onto the metal plate 103 with solder 106a and has a wiring pattern including ceramic front and back sides coated with Cu foil. The ceramic is, for example, aluminum oxide ($Al_2O_3$) or aluminum nitride (AlN).

Power semiconductor elements 107, e.g., IGBTs or reflux diodes are bonded onto the insulating substrate 105 with solder 106b. An electrode formed on the surface of the power semiconductor element 107 and a relay electrode 108 on the resin case 102 are connected to each other via an aluminum wire 109.

Furthermore, a control board 112 is disposed directly above the power semiconductor element 107. The control board 112 has a control element 110 for controlling the power semiconductor elements 107 and so on and a passive component 111, e.g., a capacitor or a resistor. Pin holes 115 on the control board 112 are inserted onto the relay electrodes 108, electrically connecting the power semiconductor elements 107 and the control element 110.

For protection from an external environment, the power semiconductor elements 107 are molded with silicone gel 113 that is charged into a recessed part 114 of the resin case 102.

CITATION LIST

Patent Literatures

Patent Literature 1: Japanese Patent Laid-Open No. 2003-243609
Patent Literature 2: Japanese Patent No. 4177571
Patent Literature 3: Japanese Patent No. 4108909

SUMMARY OF INVENTION

Technical Problem

However, the manufacturing of the conventional semiconductor device requires multiple steps. Specifically, the following assembling steps are needed: the resin case 102 having the metal terminal 101 in a custom shape is manufactured; the resin case 102 and the metal plate 103 having the power semiconductor elements 107 are joined to each other; the electrode formed on the surface of the power semiconductor element 107 and the relay electrode 108 on the resin case 102 are connected via the aluminum wire 109; and then the relay electrode 108 on the resin case 102 is electrically connected to the control board 112.

In the conventional semiconductor device, the multiple relay electrodes 108 located in the recessed part 114 of the resin case 102 need to be inserted into the pin holes 115 of the control board 112. This may reduce ease of assembly.

An object of the present invention is to provide a semiconductor device whose structure enables high productivity, and a method of manufacturing the same.

Solution to Problem

A semiconductor device according to the present invention for solving the problem includes a block-module having an embedded power semiconductor element, a first lead and a second lead drawn therefrom; a control board for controlling the power semiconductor element; and a package having an external connection terminal in contact with the first lead of the mounted block-module, wherein the second lead is connected to the control board while the first lead is joined to the external connection terminal.

A method of manufacturing a semiconductor device according to the present invention to solve the problem includes: preparing a block-module having an embedded power semiconductor element, a first lead and a second lead drawn therefrom; attaching the block-module to the control board while connecting the second lead to the control board so as to form a mounting structure; and joining the contact surface of the first lead to the contact surface of an external connection terminal while the mounting structure and a package are aligned with each other so as to cause the first lead to overlap the external connection terminal of the package.

Advantageous Effect of Invention

The present invention can provide a semiconductor device whose structure can achieve higher productivity than a conventional structure, and a method of manufacturing the same.

BRIEF DESCRIPTION OF DRAWINGS

FIG. 15 is a cross-sectional view showing another example of the method of manufacturing a semiconductor device according to the fourth embodiment of the present invention.

FIGS. 18(a) and 18(b) are enlarged cross-sectional views showing the principle part of a second example illustrating the method of manufacturing a semiconductor device according to the sixth embodiment of the present invention.

FIGS. 19(a) and 19(b) are enlarged cross-sectional views showing the principle part of a third example illustrating the method of manufacturing a semiconductor device according to the sixth embodiment of the present invention.

FIG. 22 is a schematic diagram showing the cross-sectional structure of a semiconductor device according to the related art.

DESCRIPTION OF EMBODIMENTS

Figure 1:
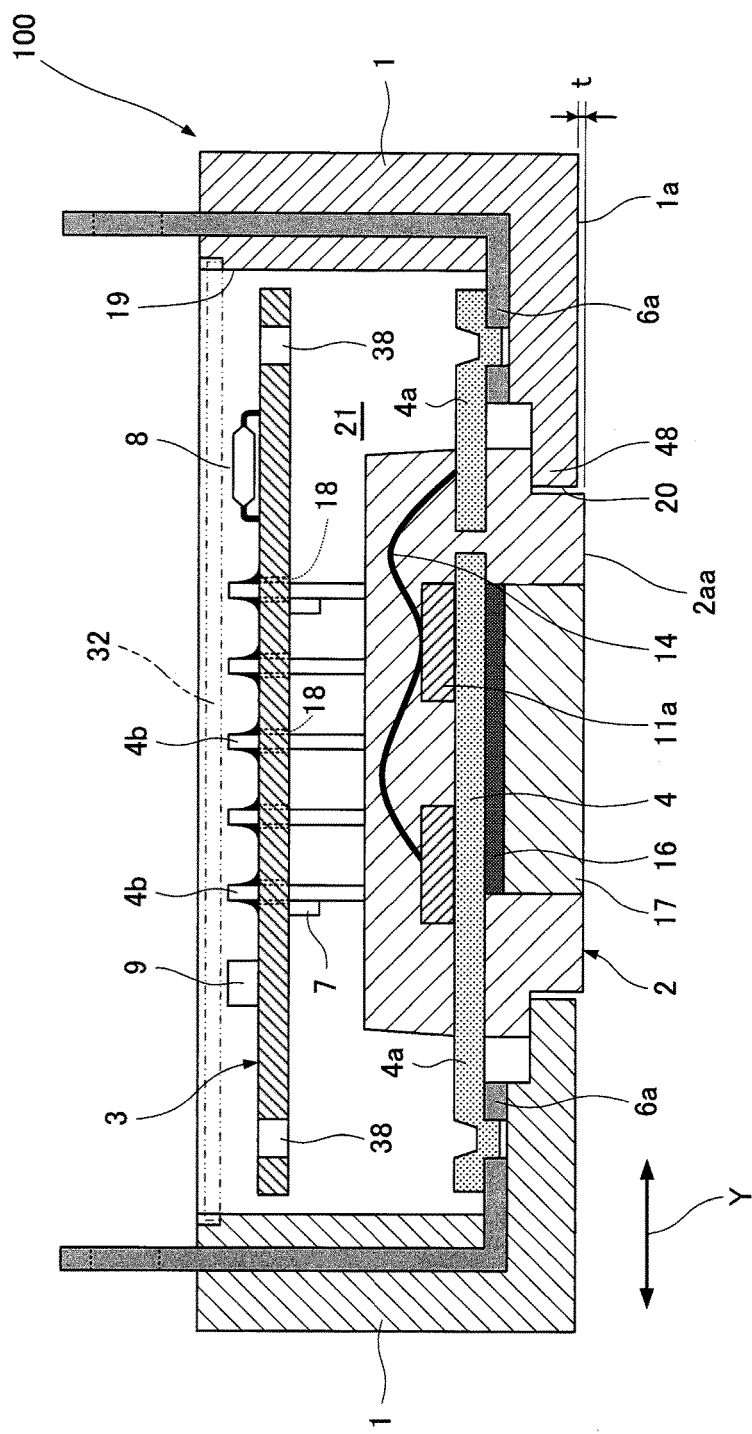
FIG. 1 is a cross-sectional view showing a semiconductor device according to a first embodiment of the present invention.

Semiconductor devices and methods of manufacturing the same according to the present invention will be described below with reference to embodiments. For example, the semiconductor device of the present invention is a power device or a power module.

The same configurations are indicated by the same reference numerals and the explanation thereof is omitted in the following explanation.

In the following explanation, the semiconductor device includes an IGBT as a switching element. The present invention is not limited to IGBTs and is also applicable to semiconductor devices using other power transistors.

First Embodiment

Referring to FIGS. 1 to 10, a semiconductor device and a method of manufacturing the same will be described below according to a first embodiment of the present invention. In FIGS. 1 to 10, X direction and Y direction are optionally shown to clarify correspondences among the drawings.

FIG. 1 is a cross-sectional view illustrating the configuration of a semiconductor device 100 manufactured using the manufacturing method of the first embodiment.

In FIG. 1, the semiconductor device 100 is an assembly including an outer case 1, a block-module 2, and a control board 3.

The outer case 1 is an example of a package made of resin. The resin of the outer case 1 may be, for example, a thermosetting epoxy resin for a transfer mold. A recessed part 19 of the outer case 1 has an opening 20. A thin part 48 is formed around the opening 20. The outer case 1 has external connection terminals 6a. One ends of the external connection terminals 6a are exposed at the bottom of the recessed part 19. The external connection terminals 6a are insert-molded into the outer case 1.

The block-module 2 has embedded power semiconductor elements 11a, a lead frame 4, an aluminum wire 14, an insulating layer 16, and a heat sink 17. First leads 4a and second leads 4b are drawn from the block-module 2. The first lead 4a is a power input/output lead. The second lead 4b is a control signal input lead. As shown in FIG. 6(b), the drawn second leads 4b are vertically bent upward from the block-module 2. The first leads 4a are horizontally drawn from the block-module 2. The first leads 4a and the second leads 4b constitute a part of the lead frame 4.

Figure 7:
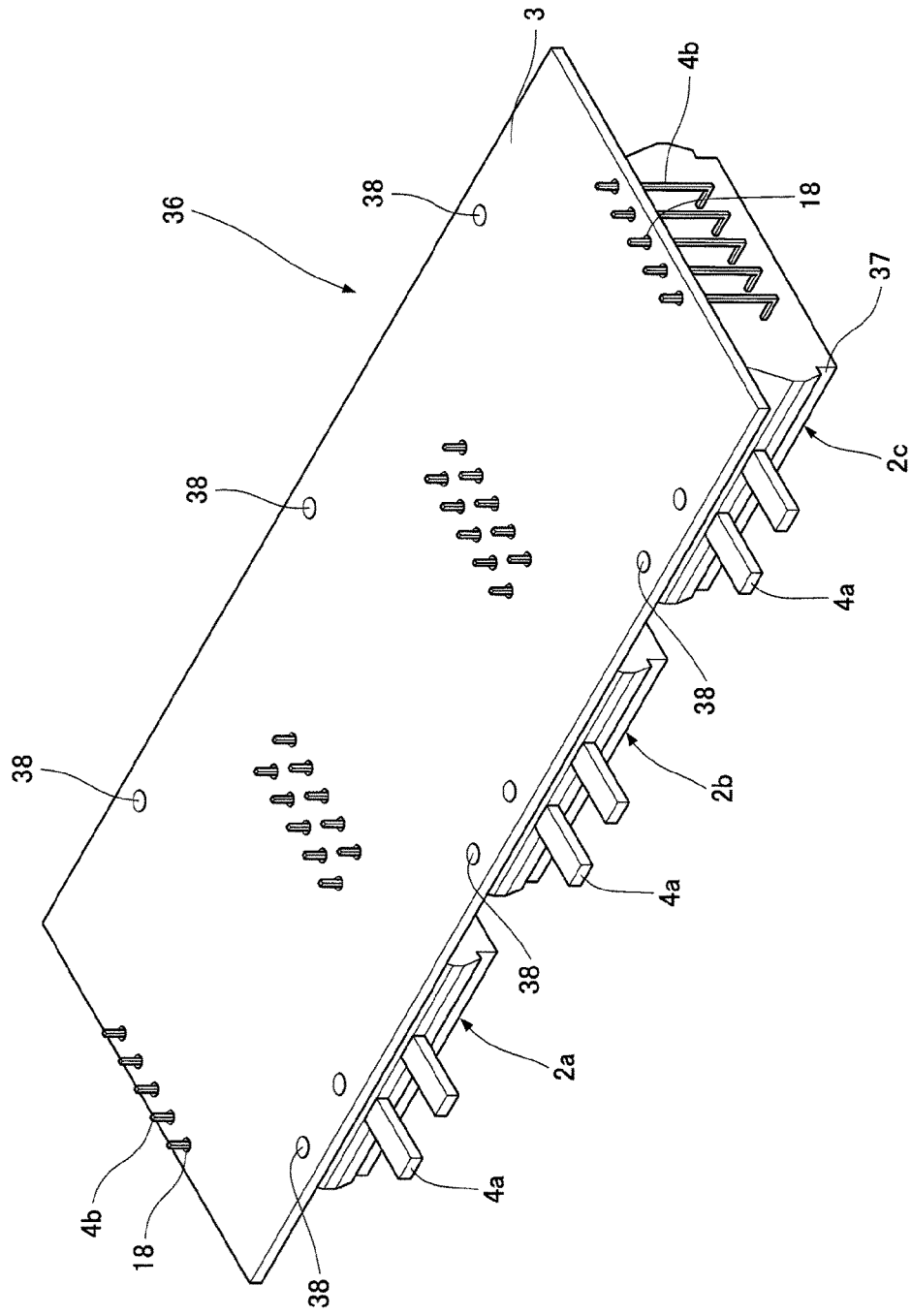
FIG. 7 is a perspective view showing a mounting structure used for the semiconductor device according to the first embodiment of the present invention.

On the control board 3, a control element 8 and a passive component 9 are mounted so as to construct an electric circuit for generating a control signal. The passive component 9 is, for example, a resistor or a capacitor. As shown in FIG. 7, the control board 3 has through holes 18 and through holes 38.

The second leads 4b are electrically connected to the control board 3 by, for example, soldering while being inserted into the through holes 18 of the control board 3. The second leads 4b are bent in a direction separating from the block-module 2. A projecting portion 7 is formed on the second lead 4b. The projecting portion 7 is engaged with the back side of the control board 3 to regulate the positional relationship between the block-module 2 and the control board 3, forming a predetermined clearance between the block-module 2 and the control board 3.

The first leads 4a are crimped over the exposed surfaces of the external connection terminals 6a so as to be electrically connected to the external connection terminals 6a.

A bottom 2aa of the block-module 2 slightly projects out of a bottom 1a of the outer case 1 while the first leads 4a and the external connection terminals 6a are electrically connected to each other. The bottom 2aa of the block-module 2 has a projection amount t of about 0.1 mm.

In the semiconductor device 100 according to the first embodiment of FIG. 1, the recessed part 19 is not filled with the silicone gel 113 or the like illustrated in FIG. 22. Thus, an air layer 21 is formed between the block-module 2 and the control board 3 with the projecting portions 7 keeping the clearance. Moreover, the top opening of the recessed part 19 may have a lid 32 indicated by a virtual line.

In the semiconductor device 100 according to the first embodiment, a control signal is supplied from the control board 3 to the gate terminal of the power semiconductor element 11a of the block-module 2 through the second lead 4b so as to provide on-off control for the source terminal and the drain terminal of the power semiconductor element 11a.

Figure 2:
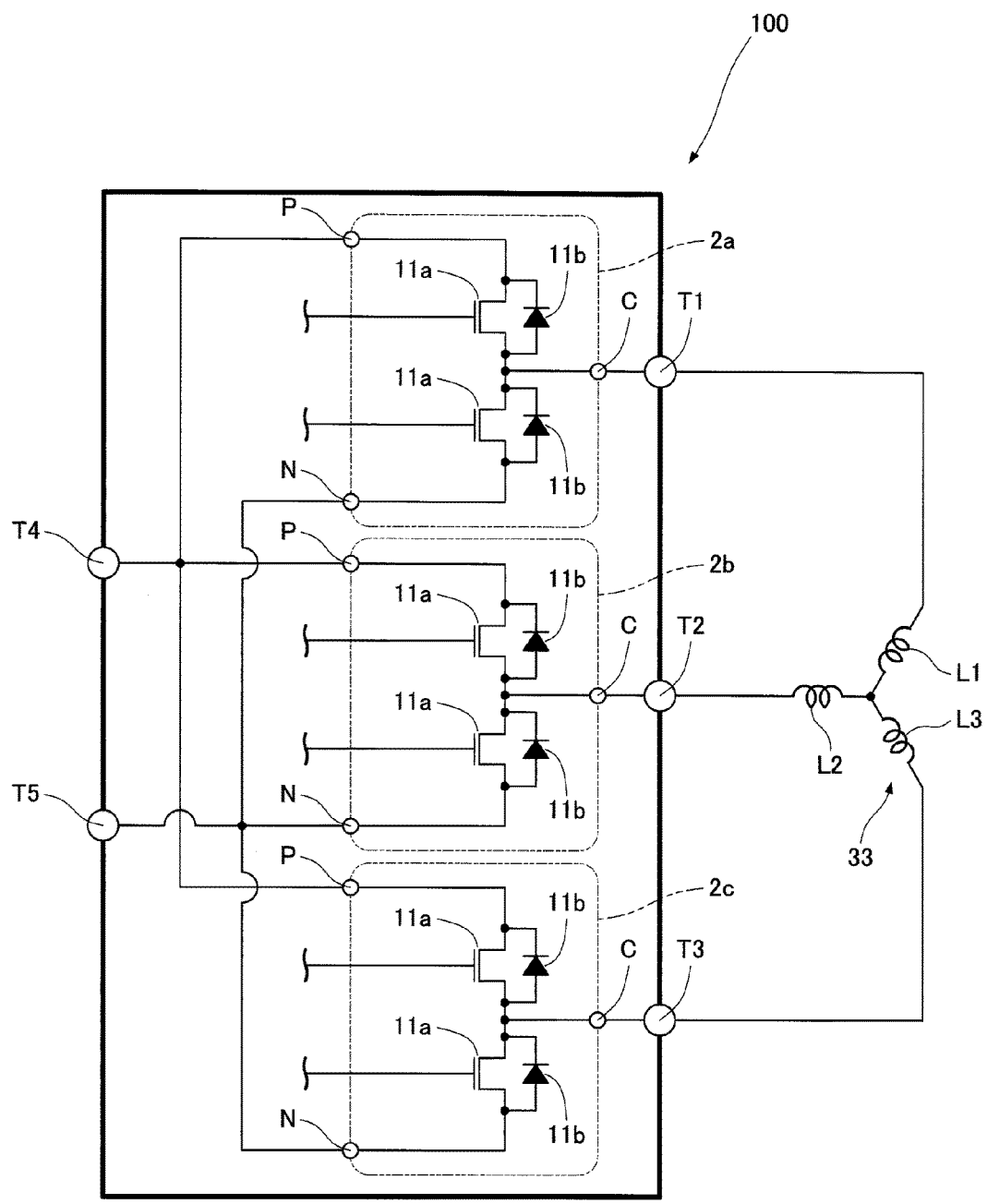
FIG. 2 is a circuit diagram showing a usage state of the semiconductor device according to the first embodiment of the present invention.

FIG. 2 is a circuit diagram showing a usage state of the semiconductor device 100 according to the first embodiment of the present invention. In FIG. 2, the semiconductor device 100 operates a load 33 having windings L1, L2, and L3. As shown in FIG. 2, in this example, the semiconductor device 100 according to the first embodiment is a three-phase semiconductor device.

Figure 3:
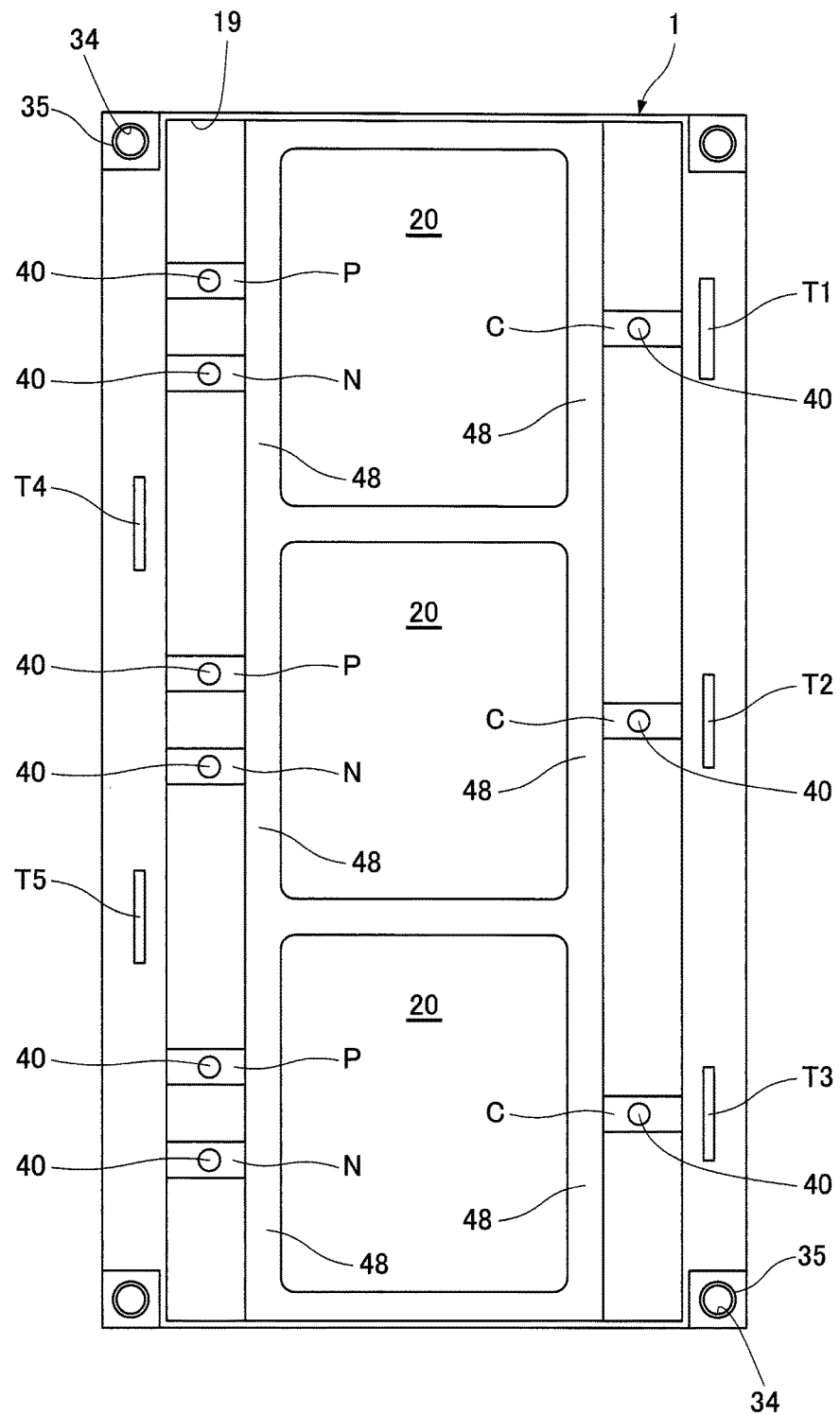
FIG. 3 is a plan view of an outer case according to the first embodiment of the present invention.
Figure 4:
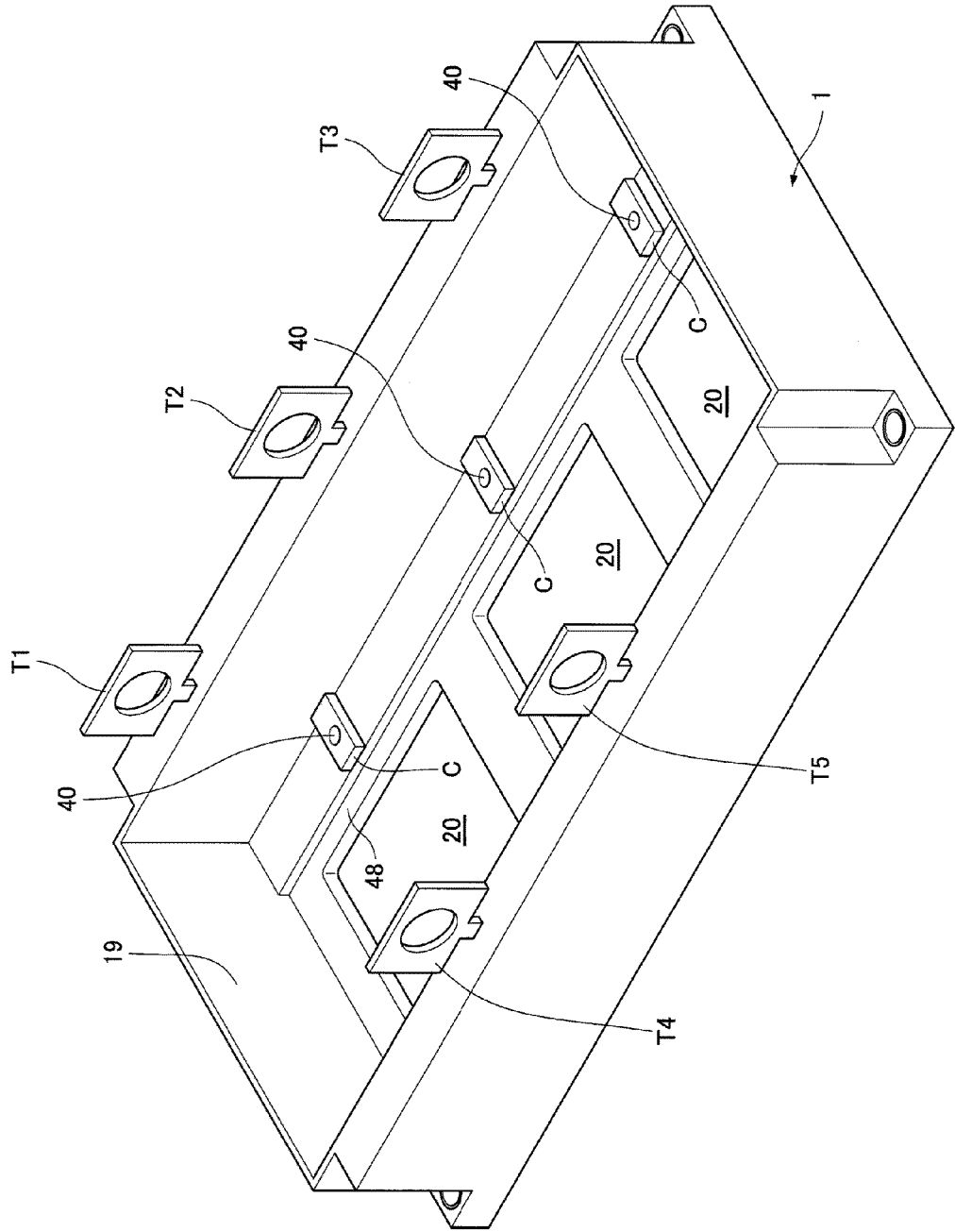
FIG. 4 is a perspective view of the outer case according to the first embodiment of the present invention.
Figure 5:
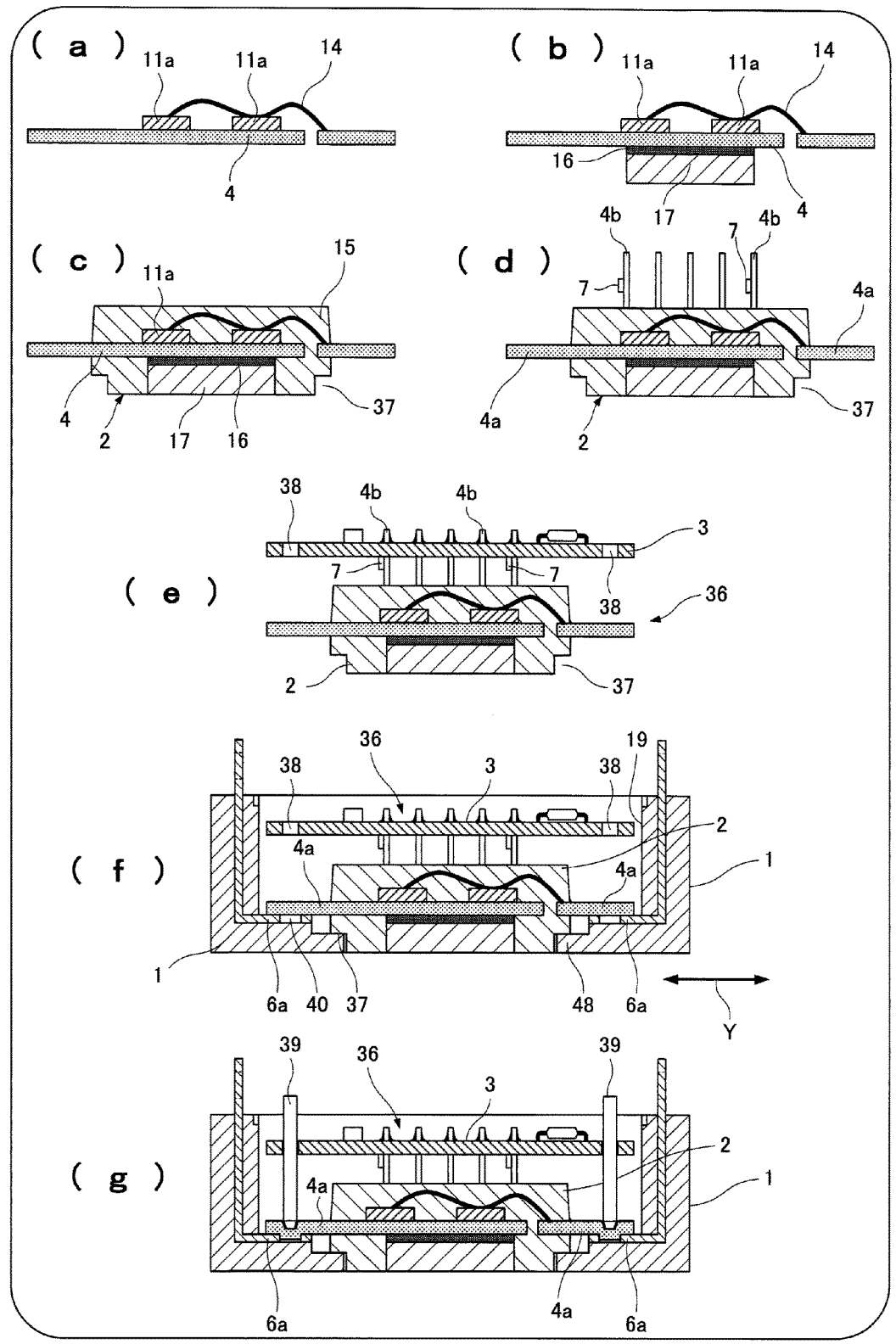
FIGS. 5(a) to 5(g) are process drawings showing a method of manufacturing a semiconductor device according to the first embodiment of the present invention.
Figure 6:
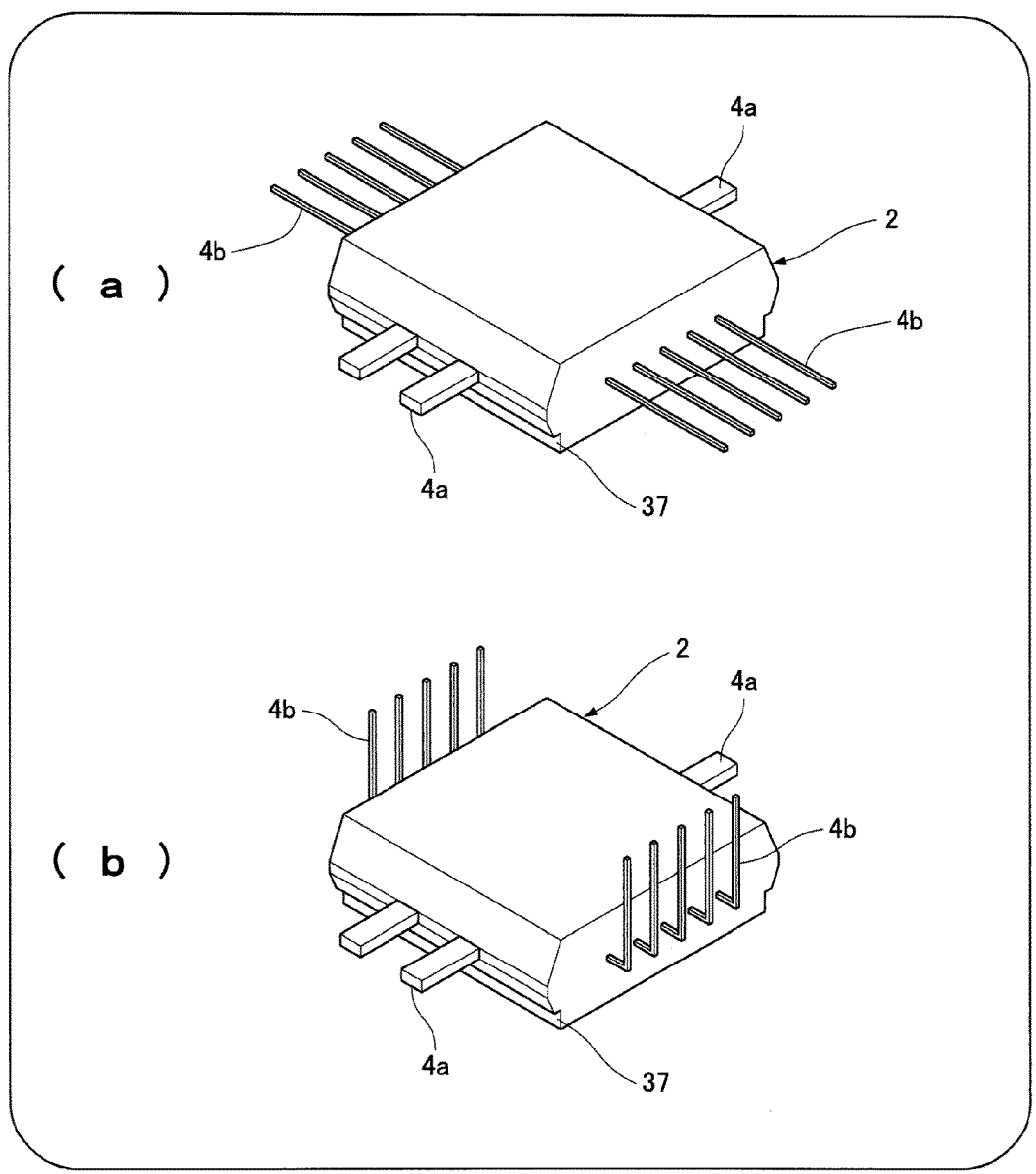
FIGS. 6(a) and 6(b) are perspective views showing a block-module used for the semiconductor device according to the first embodiment of the present invention.

FIG. 3 is a plan view of the outer case 1. FIG. 4 is a perspective view of the outer case 1. FIGS. 3 and 4 only illustrate the outer case 1.

In FIG. 2, the block-module 2 of the three-phase semiconductor device includes three block-modules 2a, 2b, and 2c. The block-modules 2a, 2b, and 2c in FIG. 2 each constitute a half bridge circuit including two IGBT power semiconductor elements 11a connected in series. The block-modules 2a, 2b, and 2c are one-phase inverters each of which have a positive terminal P, a negative terminal N, and a load connection terminal C. The block-modules 2a, 2b, and 2c each have diodes 11b.

As shown in FIGS. 3 and 4, the bottom of the recessed part 19 of the outer case 1 is provided with the load connection terminal C connected to a terminal T1, the load connection terminal C connected to a terminal T2, the load connection terminal C connected to a terminal T3, the three positive terminals P connected to a terminal T4, and the three negative terminals N connected to a terminal T5. The load connection terminals C, the positive terminals P, and the negative terminals N are examples of the external connection terminal 6a. A metal ring 35 for reinforcement is inserted into a mounting hole 34 on each corner of the outer case 1. The external connection terminals 6a (the load connection terminal C, the positive terminal P, and the negative terminal N) each have a recessed part 40.

The semiconductor device 100 of the first embodiment can be manufactured in first to seventh steps illustrated in FIGS. 5(a) to 5(g). Referring to FIGS. 5(a) to 5(g), the manufacturing process of the semiconductor device 100 according to the first embodiment will be described below.

In the first step, as shown in FIG. 5(a), the power semiconductor elements 11a and the diodes 11b (not shown) are first mounted on the surface of the lead frame 4. Moreover, the surface electrodes of the power semiconductor elements 11a and the lead frame 4 are electrically connected to each other via the aluminum wire 14. The power semiconductor elements 11a and the diodes 11b are connected in anti-parallel.

The lead frame 4 is desirably made of Cu having high thermal conductivity in view of heat dissipation. Moreover, the power semiconductor elements 11a are desirably bonded to the lead frame 4 with a material having high thermal conductivity. Specifically, the bonding material is a metallic material having high thermal conductivity, e.g., Sn—Ag—Cu solder. Since the bonding of the aluminum wire 14 eliminates the need for a bonding material at room temperature, the aluminum wire 14 is preferably bonded by ultrasonic bonding. The source electrode of the power semiconductor element 11a receives a large current of several A (amperes) to several hundreds A (amperes). Thus, at least two aluminum wires 14 need to be bonded so as not to be melted. The aluminum wire 14 may be an aluminum foil ribbon and does not always need to be shaped like a wire as illustrated in FIGS. 5(a) to 5(g). A current flowing to the gate electrode of the power semiconductor element 11a is smaller than that of the source electrode of the power semiconductor element 11a,
causing the gate electrode to have a smaller gate area. Thus, the aluminum wire 14 for the gate electrode may be smaller in width than the wire for the source electrode. For example, the aluminum wire 14 may be an aluminum wire having a diameter of 150 μm.

In the second step, as shown in FIG. 5(b), the insulating layer 16 and the heat sink 17 are bonded to the back side of the lead frame 4. In other words, the heat sink 17 is thermally connected to the power semiconductor elements 11a via the lead frame 4 and the insulating layer 16. The insulating layer 16 is an adhesive layer. The insulating layer 16 and the heat sink 17 are bonded to each other beforehand into a desired shape, and then the insulating layer 16 and the heat sink 17 are bonded to the lead frame 4. In the case where the insulating layer 16 is made of a thermosetting resin, conditions such as a bonding temperature need to be adjusted so as not to completely harden the resin when the insulating layer 16 is bonded beforehand, thereby keeping the adhesion of the insulating layer 16. This is because the insulating layer 16 is bonded to the heat sink 17 and the lead frame 4. The insulating layer 16 is desirably made of resin having heat dissipating and insulating characteristics. The insulating layer 16 may be made of a highly thermal conductive filler such as aluminum oxide ($Al_2O_3$) or boron nitride (BN).

In the third step, as shown in FIG. 5(c), the lead frame 4 having the power semiconductor elements 11a is molded with resin 15 into the block-module 2. The lead frame 4 can be molded with the resin 15 by, for example, transfer molding using a thermosetting epoxy resin and a molding die. At this point, in the first embodiment, the back side of the heat sink 17 is in contact with the molding die, exposing the back side of the heat sink 17 to the outside of the block-module 2 after molding. This is because the resin 15 covering the back side of the heat sink 17 during molding may interrupt a heat dissipating path from the power semiconductor elements 11a and lead to higher thermal resistance. Furthermore, grooves 37 are formed on the bottom of the block-module 2 by using a molding die having a special shape. FIG. 6(a) illustrates the block-module 2 in the state of FIG. 5(c). As shown in FIG. 6(a), one end of the second lead 4b drawn from the block-module 2 is connected to the control signal input circuit of the block-module 2.

In the fourth step, as shown in FIG. 5(d), the second leads 4b undergo forming so as to be bent 90° upward away from the block-module 2. FIG. 6(b) shows a state of the second leads 4b after the forming.

In the fifth step, as shown in FIG. 5(e), a mounting structure 36 is fabricated with the three block-modules 2 mounted on the control board 3. Specifically, in the fifth step, the second leads 4b of the block-modules 2 are inserted into the through holes 18 of the control board 3 and then are fixed by electrically connecting the second leads 4b and the control board 3 by, for example, soldering. The projecting portions 7 formed on the second leads 4b support the control board 3, keeping the predetermined clearance between the block-modules 2 and the control board 3. If the second leads 4b have tapered ends, the second leads 4b can be easily inserted into the through holes 18. FIG. 7 shows the mounting structure 36 fabricated thus.

Figure 8:
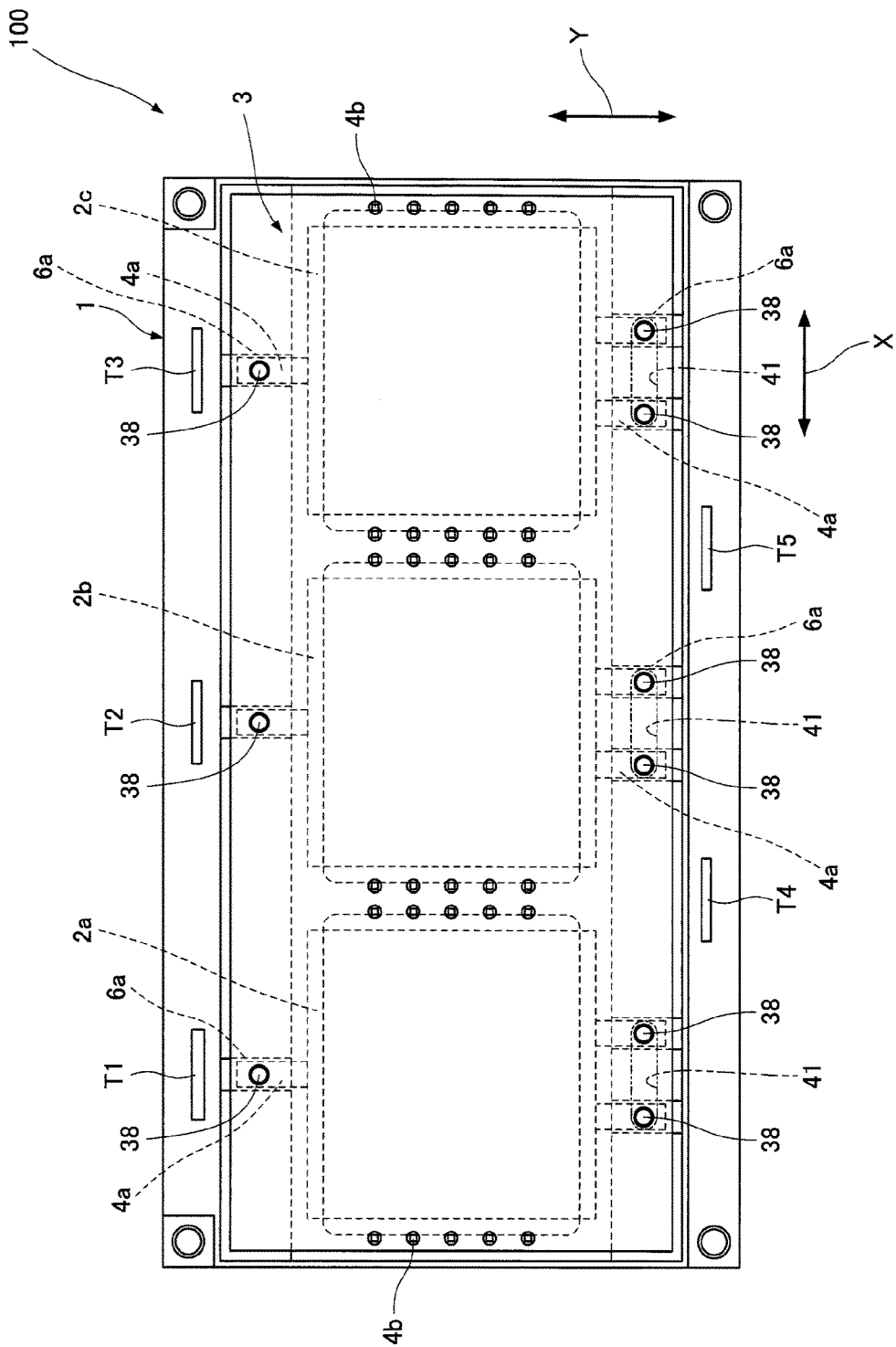
FIG. 8 is a plan view showing the semiconductor device according to the first embodiment of the present invention.
Figure 9:
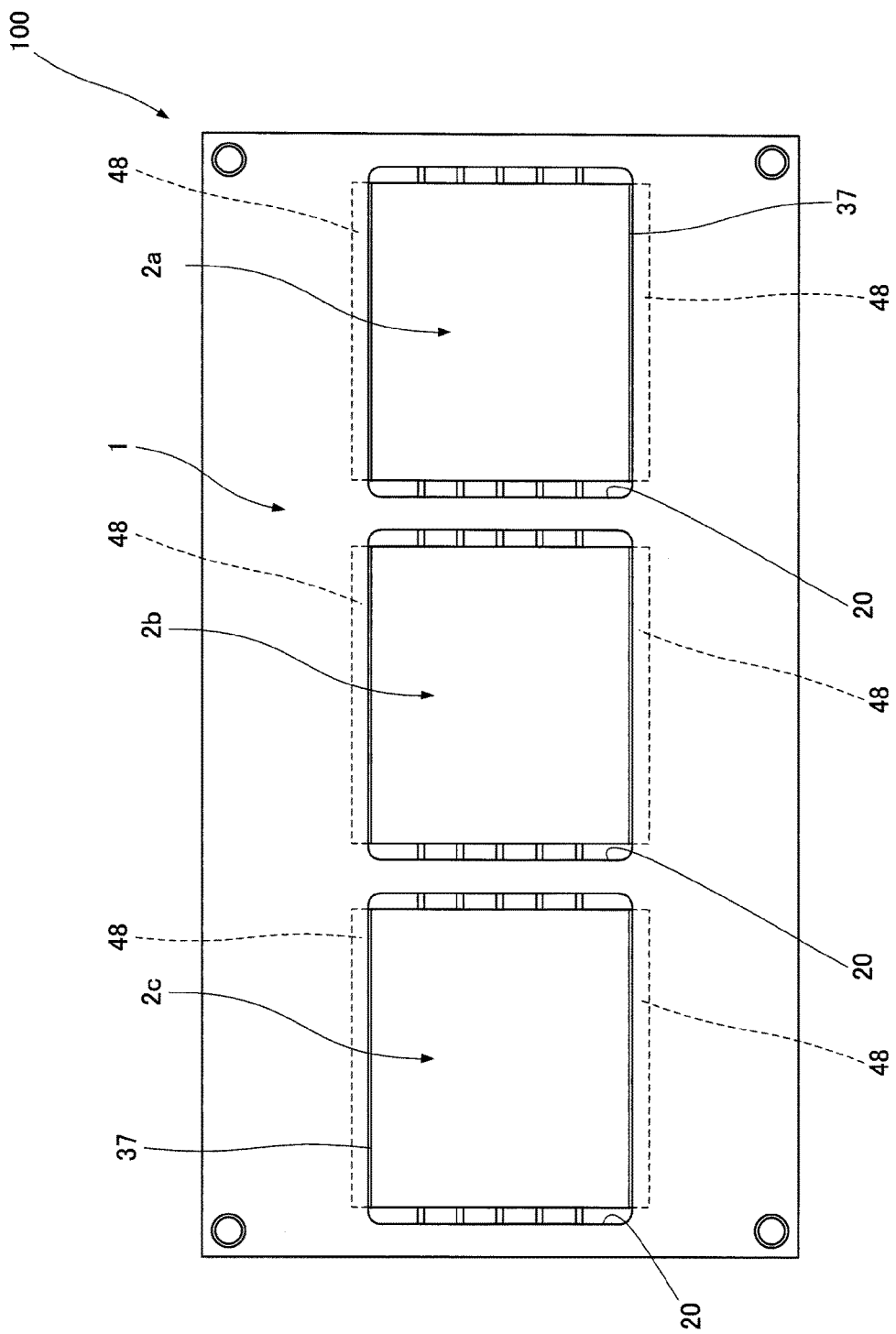
FIG. 9 is a bottom view showing the semiconductor device according to the first embodiment of the present invention.

In the sixth step, as shown in FIG. 5(f), the mounting structure 36 is inserted into the recessed part 19 of the outer case 1. The mounting structure 36 inserted into the recessed part 19 is located in the Y direction (perpendicular to the array direction X of the block-modules 2) such that the end of the thin part 48 is in contact with the grooves 37 of the block-modules 2. Specifically, the mounting structure 36 inserted into the recessed part 19 is located in the Y direction such that the thin part 48 around the openings 20 of the outer case 1 is engaged with the grooves 37 formed on the bottom of the block-module 2. In this configuration, the grooves 37 on the bottom of the block-module 2 can be formed by the molding die or shaving after molding. FIG. 9 is a bottom view of the semiconductor device 100. In the state of FIG. 5(f), as shown in FIG. 8, the first leads 4a of the block-modules 2 (2a, 2b, 2c) overlap the respective external connection terminals 6a (the positive terminal P, the negative terminal N, and the load connection terminal C) of the terminals T1, T2, and T3 provided on the outer case 1. A width d of the first lead 4a and a width D of the external connection terminal 6a of the outer case 1 are both 1 mm to 10 mm in the case where the semiconductor device 100 is designed for 75 A (amperes). The relationship of "d≤D" is preferable.

In the first embodiment, as shown in FIGS. 7 and 8, the through holes 38 of the control board 3 are formed beforehand in alignment with the overlapping positions of the first leads 4a of the block-modules 2 and the external connection terminals 6a. The through holes 38 formed beforehand on the control board 3 allow joining of the first leads 4a to the external connection terminals 6a (for example, by crimping) also in the mounting structure 36 of the first embodiment. In this configuration, at the overlapping positions of the first leads 4a and the external connection terminals 6a, the first leads 4a and the external connection terminals 6a overlap each other in an XY plane.

In the seventh step, as shown in FIG. 5(g), the first leads 4a are joined to the external connection terminals 6a by inserting crimping tools 39, which are an example of a joining tool, from the through holes 38 of the control board 3 to the first leads 4a. The crimping and joining with the crimping tools 39 electrically connect the first leads 4a of the block-modules 2 and the external connection terminals 6a of the outer case 1.

In the first embodiment, since the recessed part 40 is formed on the external connection terminal 6a, the crimping with the crimping tools 39 presses a part of the first lead 4a into the recessed part 40 of the external connection terminal 6a. Thus, in the first embodiment, the first lead 4a and the external connection terminal 6a are firmly joined to each other.

The semiconductor device 100 in FIG. 1 can be manufactured by an assembling process including the first to seventh steps.

In the first embodiment, the second leads 4b of the block-modules 2 are inserted into the through holes 18 of the control board 3, and then the second leads 4b and the control board 3 are electrically joined and fixed to each other by soldering and so on. This process can be performed outside the outer case 1. Hence, the method of manufacturing the semiconductor device 100 of the first embodiment leads to high workability with ease.

Furthermore, in the semiconductor device 100 of the first embodiment, the mounting structure 36 during the manufacturing process can be energized for a performance test, thereby further improving yields.

In the case where a performance test can be conducted on the mounting structure 36, the mounting structure 36 can be prepared regardless of the shapes of the terminals T1 to T5 projecting out of the outer case 1. Thus, a plurality of kinds of mounting structures 36 are prepared beforehand so as to be assembled into the outer case 1 like a unit structure. Specifically, when the shapes of the terminals T1 to T5 of the outer case 1 are determined, the prepared mounting structures 36 can be assembled into the outer case 1 in the steps of FIGS. 5(f) and 5(g). In the first embodiment, the mounting structure 36 is formed during the fabrication of the semiconductor device 100, thereby improving the productivity of the semiconductor device 100.

The semiconductor device 100 of the first embodiment is assembled into a target unit before use. The target unit is a unit where the semiconductor device 100 is assembled, e.g., a photovoltaic power generation system, or a motor for home use or an EV. For example, the bottom 1a of the outer case 1 is directed to the target unit; meanwhile, the four corners of the outer case 1 are screwed to the case or the heat sink of the target unit, thereby assembling the semiconductor device 100 into the target unit. At this point, the block-module 2 projected by the projection amount t from the outer case 1 is pressed into the outer case 1 by the target unit so as to elastically or plastically deform the first leads 4a. The elastic deform or plastic deform of the first leads 4a can bring the heat sink 17 of the block-module 2 into intimate contact with the case or heat sink of the target unit, improving thermal conductivity. At this point, the thermal conductivity can be further improved by applying thermal conductive grease or a thermal conductive sheet between the case or heat sink of the target unit and the heat sink 17.

In the first embodiment, the through holes 38 for the insertion of the crimping tools 39 on the control board 3 are separately formed in alignment with crimping positions. As indicated by virtual lines in FIG. 8, a single through hole 41 for the adjacent crimping positions can achieve the same effect. Replacing the multiple through holes 38 with the single through hole 41 may reduce the rigidity and elasticity of the control board 3 but save work for forming the through hole.

Figure 10:
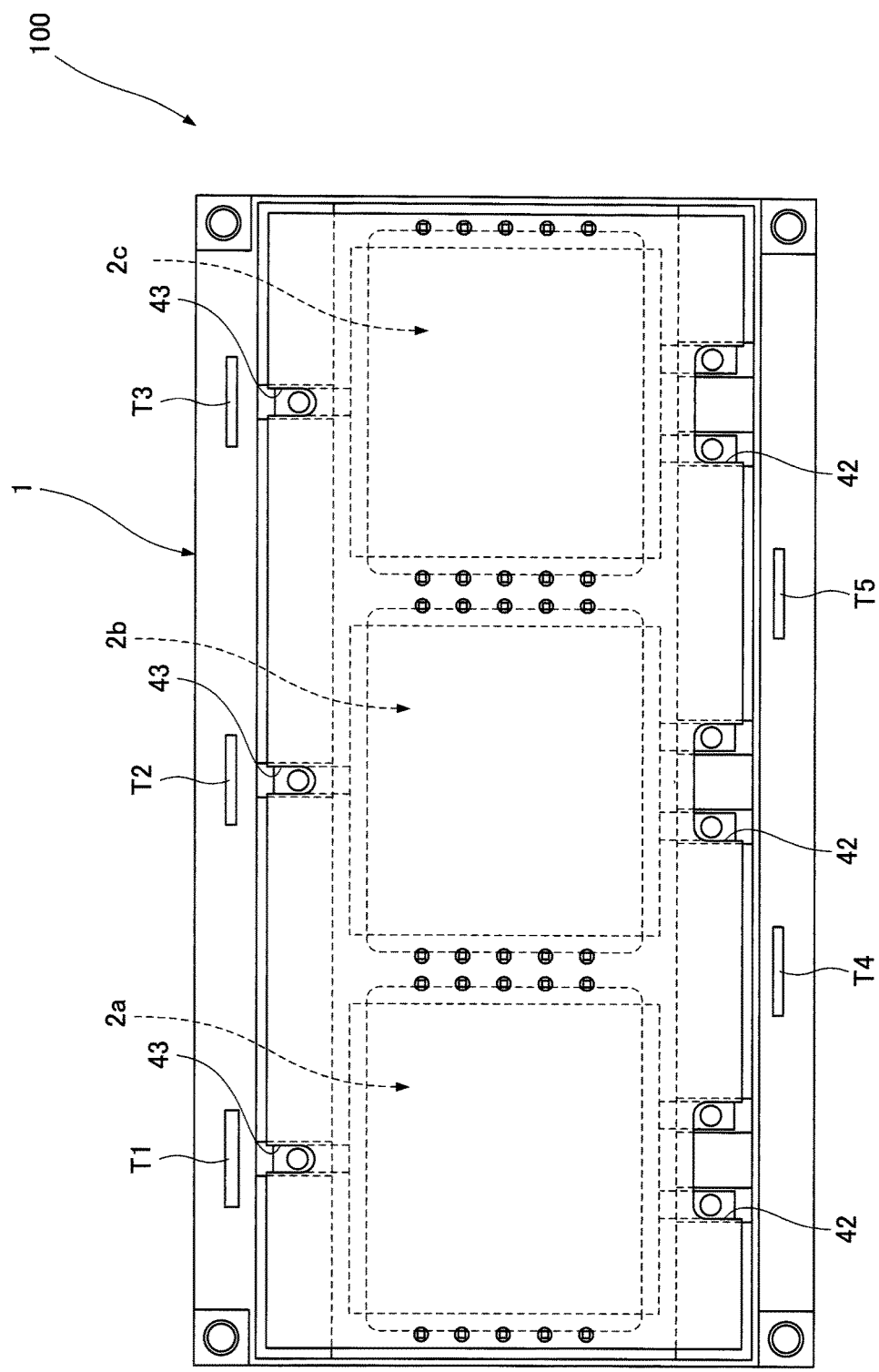
FIG. 10 is a plan view showing a modification of the first embodiment of the present invention.

Furthermore, the through holes 38 and 41 for the insertion of the crimping tools 39 may be replaced with notches 42 and 43 in FIG. 10 to achieve the same effect.

Second Embodiment

Figure 11:
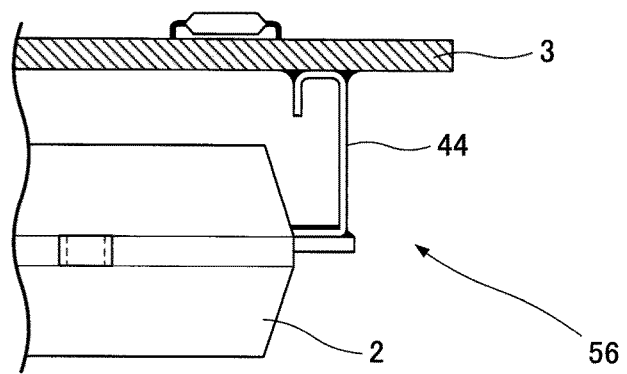
FIG. 11 is a cross-sectional view illustrating the principal part of a mounting structure used for a semiconductor device according to a second embodiment of the present invention.

FIG. 11 is a cross-sectional view illustrating the principal part of a mounting structure used for a semiconductor device according to a second embodiment of the present invention. The second embodiment is identical to the first embodiment except for a mounting structure 56 replacing the mounting structure 36 of the first embodiment, and thus an explanation of constituent elements other than the mounting structure 56 is omitted.

The mounting structure 36 of the first embodiment includes the control board 3 mounted on the ends of the second leads 4b that are drawn and bent from the block-modules 2. In the mounting structure 56 of the second embodiment, as shown in FIG. 11, a block-module 2 and a control board 3 are electrically connected to each other via intermediate members 44 that are J-leads electrically connected to second leads 4b.

Using the mounting structure 56 of the second embodiment allows the intermediate members 44 to absorb large variations in gap positions between the block-module 2 and the control board 3.

Third Embodiment

Figure 12:
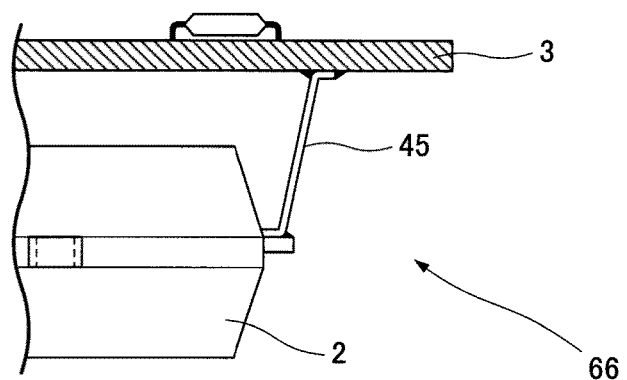
FIG. 12 is a cross-sectional view illustrating the principal part of a mounting structure used for a semiconductor device according to a third embodiment of the present invention.

FIG. 12 is a cross-sectional view showing the principal part of a mounting structure used for a semiconductor device according to a third embodiment of the present invention. The third embodiment is identical to the first embodiment other than a mounting structure 66 replacing with the mounting structure 36 of the first embodiment, and thus an explanation of constituent elements other than the mounting structure 66 is omitted.

The mounting structure 36 of the first embodiment includes the control board 3 mounted on the ends of the second leads 4b that are drawn and bent from the block-modules 2. In the mounting structure 66 of the third embodiment, as shown in FIG. 12, a block-module 2 and a control board 3 are electrically connected to each other via intermediate members 45 that are gull wings electrically connected to second leads 4b.

Using the mounting structure 66 of the third embodiment allows the intermediate members 45 to absorb large gap variations between the block-module 2 and the control board 3 and regulate the relative positions of the block-module 2 and the control board 3.

Fourth Embodiment

Figure 13:
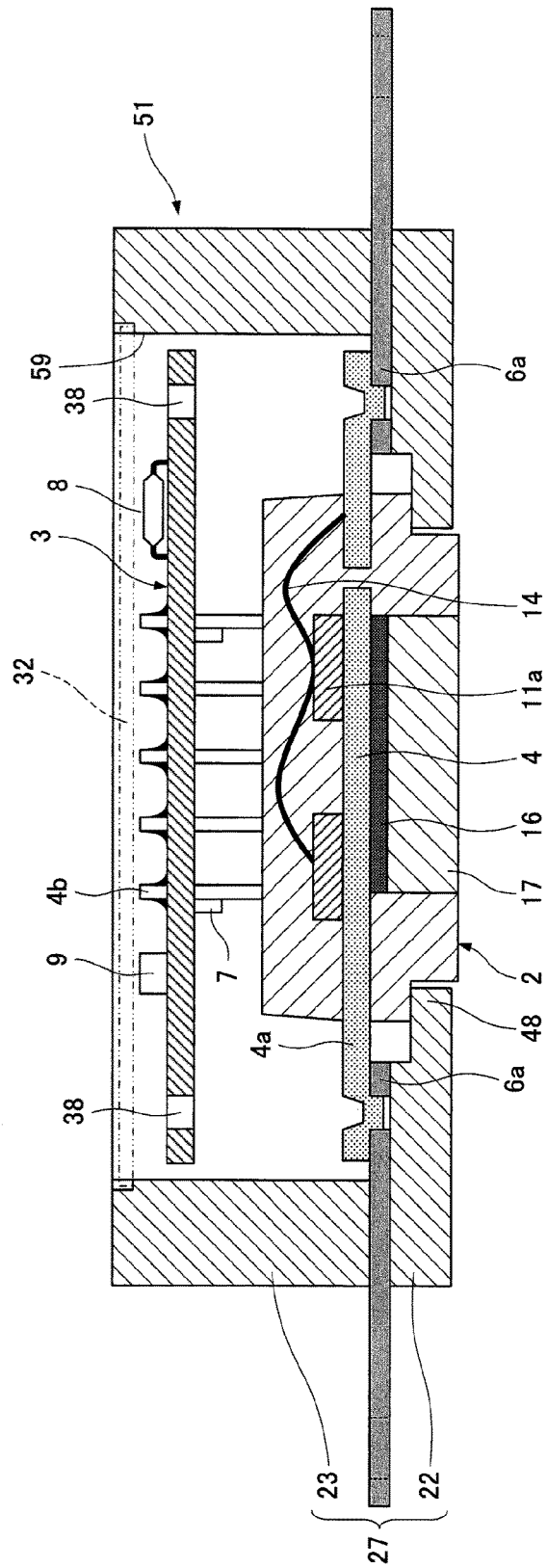
FIG. 13 is a cross-sectional view showing a semiconductor device according to a fourth embodiment of the present invention.
Figure 14:
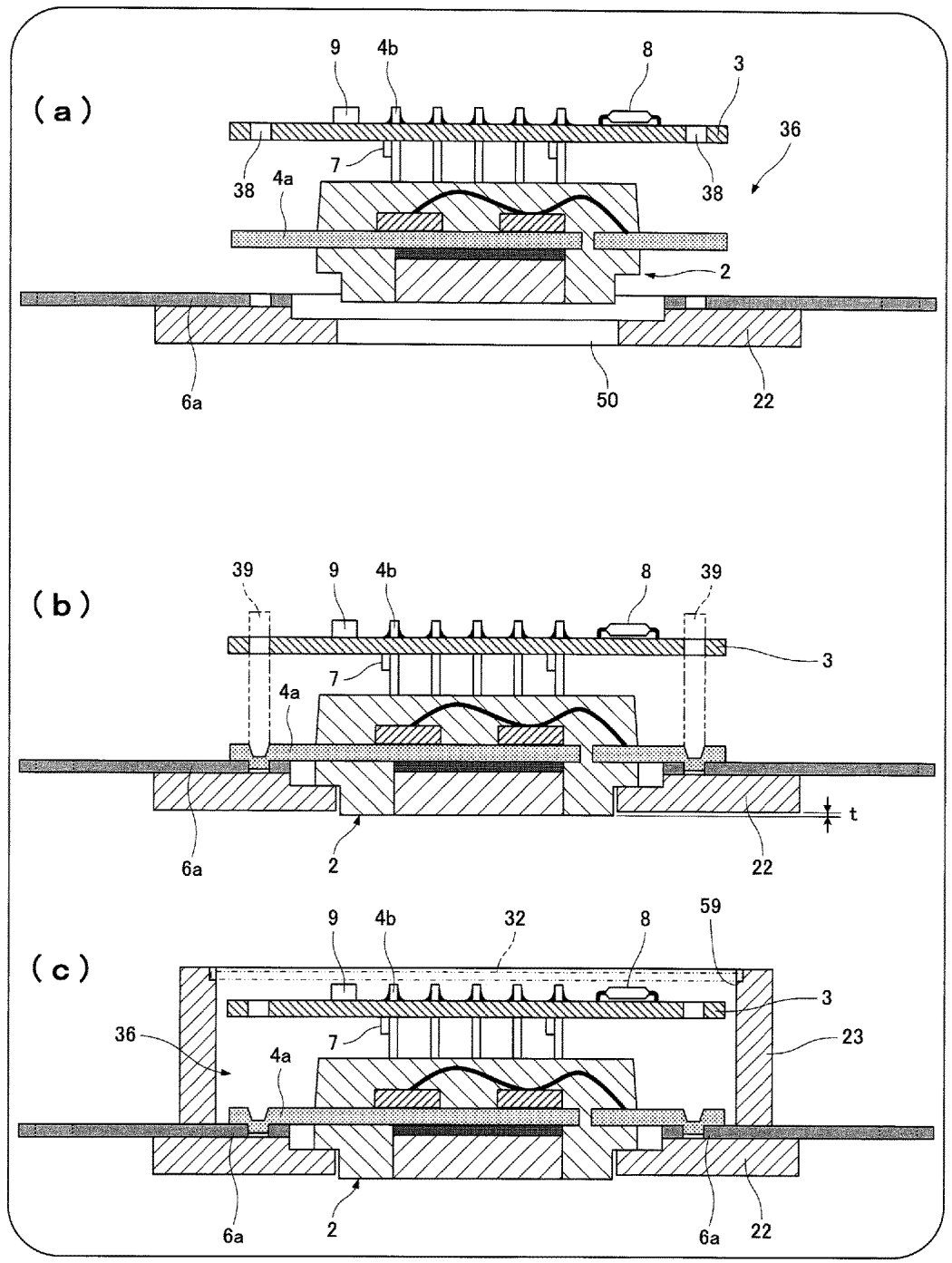
FIGS. 14(a) to 14(c) are process drawings showing a method of manufacturing a semiconductor device according to the fourth embodiment of the present invention.

Referring to FIGS. 13, 14, and 15, a semiconductor device and a method of manufacturing the same according to a fourth embodiment of the present invention will be described below.

FIG. 13 is a cross-sectional view showing the semiconductor device manufactured by the manufacturing method of the fourth embodiment.

The outer case 1 of the first embodiment includes the recessed part 19 and the insert-molded external connection terminals 6a. In the fourth embodiment, as shown in FIG. 13, an outer case 51 includes a plate-like base part 22 having external connection terminals 6a and a guard part 23 that is attached to the plate-like base part 22 so as to surround a control board 3. In other words, the outer case 51 of the fourth embodiment includes two combined members (the base part 22, the guard part 23). The configuration of a block-module 2 and the control board 3 and the assembly of the block-module 2 and the control board 3 are identical to those of the first embodiment, and thus the explanation thereof is omitted.

The semiconductor device of the fourth embodiment is assembled in the following eighth to tenth steps:

In the eighth step, as shown in FIG. 14(*a*), a mounting structure 36 is first attached to an opening 50 of the base part 22 before the guard part 23 is attached. At this point, first leads 4a of the mounting structure 36 overlap the external connection terminals 6a of the base part 22.

In the ninth step, as shown in FIG. 14(*b*), crimping tools 39 are inserted from through holes 38 to crimp the first leads 4a and the external connection terminals 6a. The crimping electrically joins the first leads 4a and the external connection terminals 6a. As indicated by virtual lines in FIG. 14(*b*), the crimping tools 39 at this point are inserted into the through holes 38.

In the tenth step, as shown in FIG. 14(*c*), the guard part 23 is attached to the base part 22 so as to surround the mounting structure 36.

In the case where a cover 26 covering the control board 3 can be formed on a part of an assembly unit, the cover 26 is disposed in a tenth step shown in FIG. 15 instead of the tenth step of FIG. 14(*c*). This can eliminate the need for the guard part 23.

Thus, in the fourth embodiment, the semiconductor device can be obtained with an outer shape substantially identical to that of the first embodiment.

Fifth Embodiment

Figure 16:
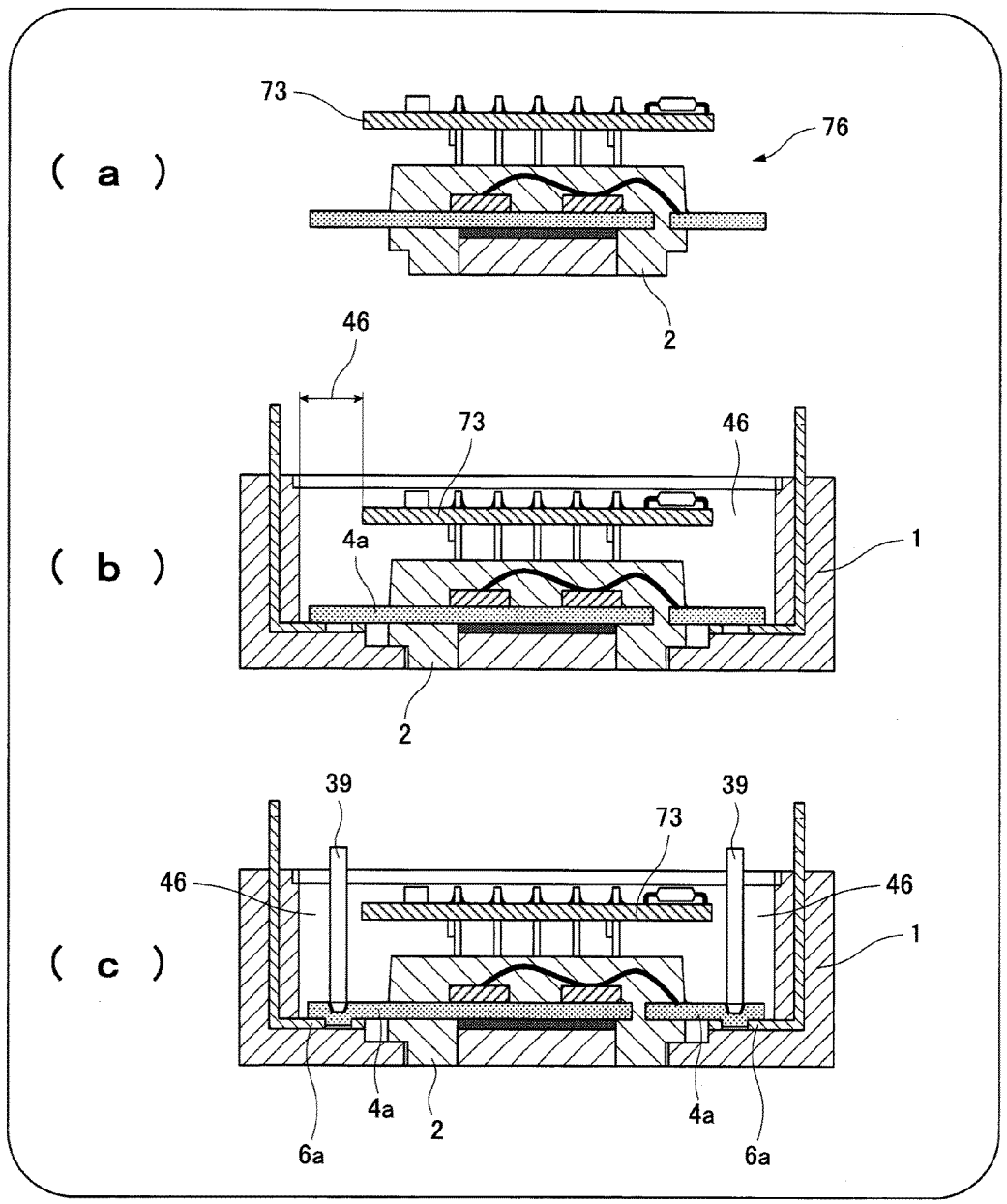
FIGS. 16(a) to 16(c) are process drawings showing a method of manufacturing a semiconductor device according to a fifth embodiment of the present invention.

Referring to FIG. 16, a method of manufacturing a semiconductor device according to a fifth embodiment of the present invention will be described below.

In the semiconductor device according to the first embodiment, the recessed part 19 of the outer case 1 accommodates the mounting structure 36 including the control board 3 substantially identical in size to the internal dimensions of the outer case 1. In the fifth embodiment, as shown in FIGS. 16(*a*) and 16(*b*), a control board 73 is provided so as to form a gap 46 in a recessed part 19 of an outer case 1. The size of the gap 46 allows the insertion of a crimping tool 39. In this case, the control board 73 does not require the through holes 38 of the first embodiment. In other words, the control board 73 of the fifth embodiment has a limited size such that the control board 73 and first leads 4a do not overlap each other at the overlapping positions of the first leads 4a and the external connection terminals 6a in an XY plane.

As shown in FIG. 16(*c*), a mounting structure 76 including the control board 73 of the fifth embodiment allows the crimping of the crimping tool 39 inserted from the gap 46. The crimping can obtain the semiconductor device having the same function as the first embodiment.

Sixth Embodiment

In the foregoing embodiments, the first leads 4a and the external connection terminals 6a are electrically joined to each other by crimping. If electrical joining can be performed through the through holes 38 and so on, other methods can be selected. The other methods include a laser bonding method using laser beams passing through the through holes 38, an ultrasonic bonding method using tools inserted into the through holes 38, heat bonding using tools inserted into the through holes 38, and chemical bonding performed by activating a bonded surface through a chemical reaction.

First Example

Figure 17:
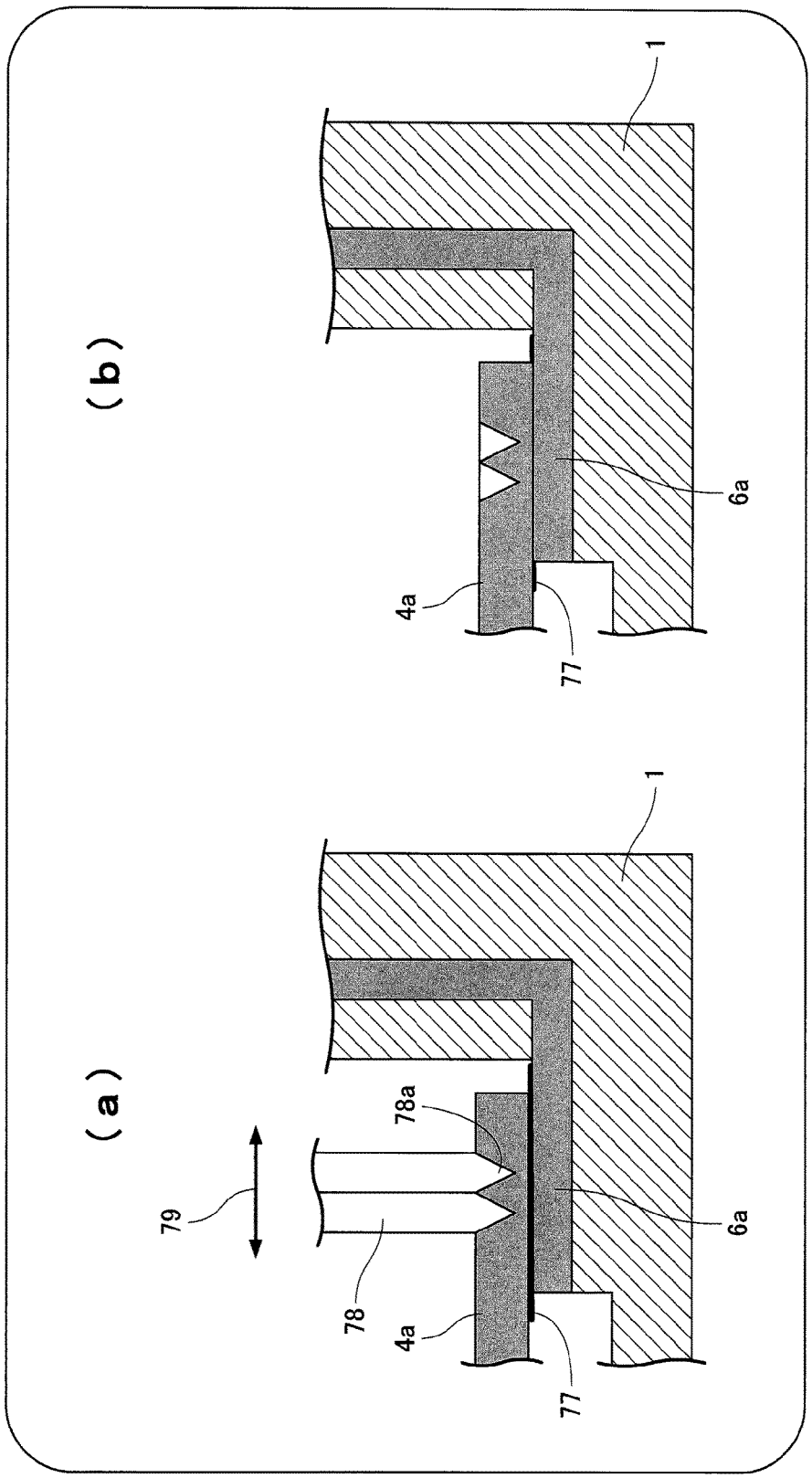
FIGS. 17(a) and 17(b) are enlarged cross-sectional views showing the principle part of a first example illustrating a method of manufacturing a semiconductor device according to a sixth embodiment of the present invention.

In a first example of FIG. 17, an external connection terminal 6a and a first lead 4a are bonded to each other by ultrasonic bonding. In this example, the external connection terminal 6a is made of the same material as the first lead 4a. Specifically, the external connection terminal 6a and the first lead 4a are both made of copper.

As shown in FIG. 17(*a*), an oxide film 77 is formed on the surface of the external connection terminal 6a or the first lead 4a. Even in this case, an ultrasonic head 78 serving as a bonding tool presses the first lead 4a to the external connection terminal 6a and applies ultrasonic vibrations to the contact surfaces of the first lead 4a and the external connection terminal 6a in the direction of an arrow 79. This can remove the oxide film 77 formed on the contact surfaces as shown in FIG. 17(*b*). The oxide film 77 on the contact surfaces is removed to press the clean surfaces of the first lead 4a and the external connection terminal 6a, allowing joining of the first lead 4a and the external connection terminal 6a.

In order to efficiently transmit the vibrations of the ultrasonic head 78 to the first lead 4a, as shown in FIG. 17(*a*), the end of the ultrasonic head 78 preferably has an anvil shape 78a having irregularities.

Second Example

In a second example of FIG. 18, the external connection terminal 6a and the first lead 4a are bonded by heat bonding. In FIG. 18, the external connection terminal 6a and the first lead 4a are bonded to each other by heating and pressing. In the second example, the external connection terminal 6a is made of the same material as the first lead 4a. Specifically, the external connection terminal 6a and the first lead 4a are both made of copper.

As shown in FIG. 18(a), the oxide film 77 is formed on the surface of the external connection terminal 6a or the first lead 4a. Even in this case, a heating head 80 serving as a bonding tool heats the first lead 4a and presses the first lead 4a to the external connection terminal 6a. This can remove the oxide film 77 formed on the contact surfaces as shown in FIG. 18(b). The clean surfaces of the first lead 4a and the external connection terminal 6a are pressed to bond the first lead 4a and the external connection terminal 6a. At this point, the first lead 4a and the external connection terminal 6a are heated, thereby accelerating a combination reaction of copper.

A pressure for the pressing of the heating head 80 is larger than that of ultrasonic bonding illustrated in FIG. 17.

Third Example

In a third example in FIG. 19, the external connection terminal 6a and the first lead 4a are bonded by chemical bonding. In FIG. 19, the external connection terminal 6a and the first lead 4a are bonded by activating a bonded surface through a chemical reaction. In this example, the external connection terminal 6a is made of the same material as the first lead 4a. Specifically, the external connection terminal 6a and the first lead 4a are both made of copper.

Also in the case where the oxide film 77 is formed on the surface of the external connection terminal 6a or the first lead 4a, as shown in FIG. 19(a), a surface-active agent 81 is dropped to the external connection terminal 6a. Thus, copper oxide (CuO) is returned to copper (Cu) by a reduction reaction. The first lead 4a is disposed on the external connection terminal 6a, and then a pressing head 82 serving as a joining tool presses the first lead 4a to the external connection terminal 6a. Thus, as shown in FIG. 18(b), the first lead 4a and the external connection terminal 6a can be joined to each other.

Seventh Embodiment

Figure 20:
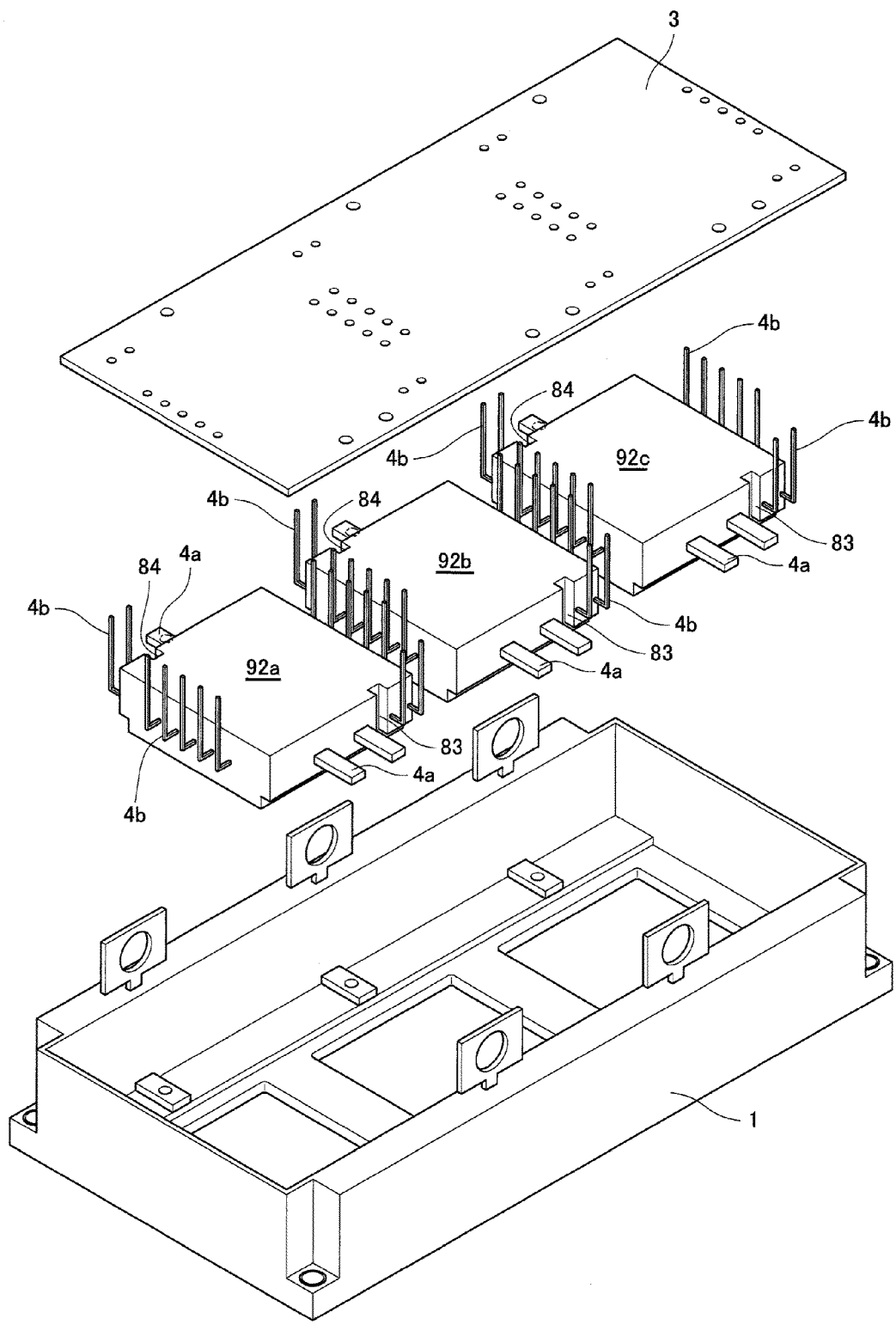
FIG. 20 is an exploded perspective view showing a semiconductor device according to a seventh embodiment of the present invention.
Figure 21:
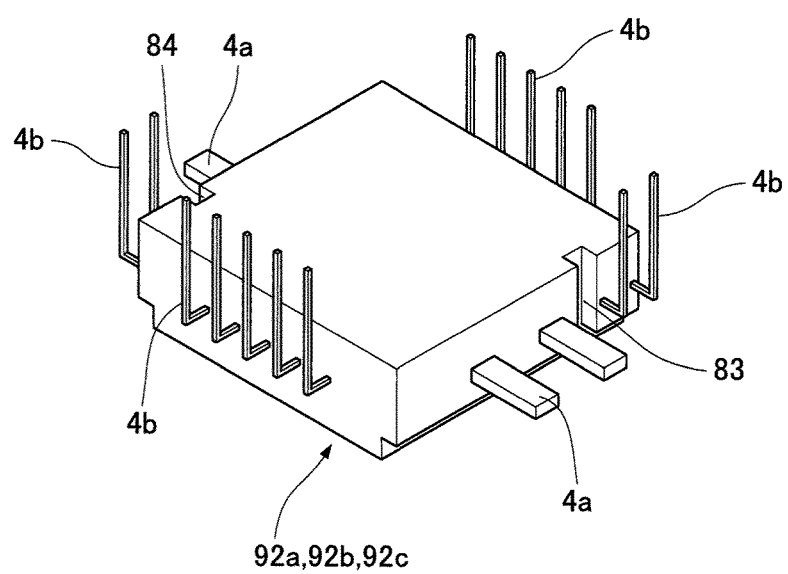
FIG. 21 is an enlarged perspective view showing a block-module in the semiconductor device according to the seventh embodiment of the present invention.

In the foregoing embodiments, as shown in FIG. 6(b), the first leads 4a and the second leads 4b are drawn from the different sides of the resin-molded block-modules 2a, 2b, and 2c. In the present embodiment, as shown in FIGS. 20 and 21, second leads 4b are drawn from the same side as first leads 4a on block-modules 92a, 92b, and 92c.

In the seventh embodiment, in order to prevent a reduction in dielectric voltage between the first lead 4a and the second lead 4b that are adjacent to each other, recessed parts 83 and 84 are formed on the outer shape of the block-module 2 so as to increase a creepage distance.

In the foregoing embodiments, the three block-modules 2 or 92 are attached to the outer case 1 in the semiconductor device 100. The number of block-modules 2 is not limited to three. The foregoing embodiments can be implemented by at least one block-module.

INDUSTRIAL APPLICABILITY

The semiconductor device of the present invention is applicable to a power conditioner in a photovoltaic power generation system or a power device used for rotation control of a motor.

1, 51 outer case
1a, 2aa bottom
2, 2,a, 2b, 2c, 92a, 92b, 92c block-module
3, 73 control board
4 lead frame
4a power input/output lead
4b control signal input lead
6a external connection terminal
7 projecting portion
8 control element
9 passive component
11a power semiconductor element
11b diode
14 aluminum wire
15 resin
16 insulating layer
17 heat sink
18 through hole
19, 40, 59, 83, 84 recessed part
20, 50 opening
21 air layer
22 base part
23 guard part
26 cover
32 lid
33 load
34 mounting hole
35 metal ring
36, 56, 66, 76 mounting structure
37 groove
38, 41 through hole
39 crimping tool
42, 43 notch
44, 45 intermediate member
48 thin part
P positive terminal
N negative terminal
C load connection terminal
T1 to T5 terminal
100 semiconductor device

The invention claimed is:

1. A semiconductor device comprising:
a block-module having an embedded power semiconductor element, a first lead and a second lead, the first and second leads extending from the block-module;
a control board for controlling the power semiconductor element; and
a package having an opening and an external connection terminal at a bottom of the package, the external connection terminal being in contact with the first lead of the block-module mounted at the bottom,
wherein the second lead is connected to the control board while the first lead is joined to the external connection terminal, and
the control board has a through hole at an overlapping position of the first lead and the external connection terminal.

2. The semiconductor device according to claim 1, wherein the control board and the first lead do not overlap each other at an overlapping position of the first lead and the external connection terminal.

3. The semiconductor device according to claim 1, wherein the block-module includes a heat sink molded so as to be partially exposed, the heat sink being thermally connected to the power semiconductor element, and
the package has an opening at a bottom of the package, the opening exposing the heat sink exposed on a surface of the block-module.

4. A semiconductor device comprising:
a block-module having an embedded power semiconductor element, a first lead and a second lead, the first and second leads extending from the block-module;
a control board for controlling the power semiconductor element; and
a package having an external connection terminal in contact with the first lead of the mounted block-module,
wherein the second lead is connected to the control board,
the first lead is joined to the external connection terminal,
the block-module includes a heat sink molded so as to be partially exposed, the heat sink being thermally connected to the power semiconductor element,
the package has an opening at a bottom of the package, the opening exposing the heat sink exposed on a surface of the block-module,
a thin part is formed around the opening, and
the block-module comprises a groove engaged with the thin part from within the package.

5. The semiconductor device according to claim 1, wherein the first lead and the external connection terminal are crimped together.

6. The semiconductor device according to claim 1, wherein the second lead is bent in a direction separating from the block-module.

7. The semiconductor device according to claim 1, wherein the second lead includes a projecting portion that regulates a positional relationship between the block-module and the control board.

8. The semiconductor device according to claim 1, further comprising an air layer formed between the block-module and the control board.

9. A unit incorporating the semiconductor device according to claim 1.

10. The semiconductor device according to claim 1, wherein the through hole of the control board does not contact with the first and second leads.

11. The semiconductor device according to claim 4, wherein the first lead is disposed on a first surface of the heat sink, and the heat sink is disposed under the first lead in the block-module and is embedded in the block-module so as to expose only a second surface of the heat sink, the second surface opposes to the first surface.

* * * * *